United States Patent
Yang et al.

(10) Patent No.: US 7,386,069 B2
(45) Date of Patent: Jun. 10, 2008

(54) MULTIPLE SIMULTANEOUS FREQUENCY AND CODE ACQUISITION FOR A CODE DIVISION MULTIPLE ACCESS (CDMA) COMMUNICATION SYSTEM

(75) Inventors: Ganning Yang, Irvine, CA (US); Terence Yim, Rancho Santa Margarita, CA (US); Chiaming Lo, Irvine, CA (US); Yi Weng, Vista, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 674 days.

(21) Appl. No.: 10/832,196

(22) Filed: Apr. 26, 2004

(65) Prior Publication Data

US 2005/0238087 A1    Oct. 27, 2005

(51) Int. Cl.
*H03D 1/00*    (2006.01)
(52) U.S. Cl. ..................................................... 375/343

(58) Field of Classification Search ................ 375/340, 375/343, 142, 143, 150, 316
See application file for complete search history.

(56) References Cited

U.S. PATENT DOCUMENTS

| | | | | |
|---|---|---|---|---|
| 5,426,665 A | * | 6/1995 | Cleverly et al. | 375/150 |
| 6,363,107 B1 | * | 3/2002 | Scott | 375/150 |
| 6,636,556 B2 | * | 10/2003 | Li | 375/146 |
| 7,016,739 B2 | * | 3/2006 | Bange et al. | 607/60 |

* cited by examiner

*Primary Examiner*—Chieh M. Fan
*Assistant Examiner*—Jaison Joseph

(57) ABSTRACT

A multiple stage matched filter for a wireless receiver comprises a receiver configured to develop a received signal, the received signal comprising a bit stream of signal samples, and a multiple stage matched filter configured to parallel process the received signal such that multiple codes are analyzed simultaneously to determine a frequency offset and code location.

20 Claims, 7 Drawing Sheets

MULTIPLE SIMULTANEOUS FREQUENCY AND CODE ACQUISITION FOR A CODE DIVISION MULTIPLE ACCESS (CDMA) COMMUNICATION SYSTEM

BACKGROUND OF THE INVENTION

1. Field of the Invention

This invention relates generally to frequency and code acquisition in a wireless portable communication device. More particularly, the invention relates to multiple simultaneous frequency and code acquisition in a code division multiple access (CDMA) communication system.

2. Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and data communications in a handheld, telephone-like communication handset. The different modulation and transmission schemes each have advantages and disadvantages.

Regardless of the type of communication system, a portable transceiver operating in a communication system must acquire a signal from a transmitter located at a base-station, so that the portable transceiver may synchronize, with respect to frequency and time (or code for a CDMA communication system), with the communication network. It is desirable to minimize the amount of time required for the portable transceiver to synchronize to the network. One of the main factors that influences the amount of time needed for synchronization is the accuracy of the frequency reference source in the portable transceiver. The frequency reference source is typically referred to as an "oscillator." If the frequency reference source is highly accurate, fewer frequencies must be searched to acquire the signal from the base station. For example, some transceivers use a temperature controlled crystal oscillator (TCXO) to derive the proper frequency reference signal. Generally, a TCXO is accurate to within a few parts per million (ppm), such that frequency acquisition time is minimized. For example, a frequency reference source that is accurate to within 2-3 ppm allows less frequency drift than a frequency reference source that is accurate to within 20 ppm.

Unfortunately, the accuracy of the oscillator is directly proportional to its cost. In other words, a highly accurate TCXO will cost significantly more than, for example, a capacitor controlled crystal oscillator (CCXO), which may have a frequency accurate to within, for example, 15-20 ppm.

With the continued drive in the industry toward reducing cost, it would be desirable to reduce the cost of the portable communication device by reducing the cost of the oscillator. For example, in a portable communication device, it would be desirable to use a CCXO instead of a TCXO as the frequency reference source. Unfortunately, because the CCXO is less accurate than other available frequency references sources, in some circumstances the frequency acquisition time of a portable communication device using a CCXO may exceed the allowable time.

In a 3G application for a system operating in the wideband code division multiple access (WCDMA) communication system, a synchronization channel, or signal, referred to as the synchronization channel (SCH), is used for cell search and code acquisition. The SCH comprises two sub-channels, the primary SCH (PSCH) and the secondary SCH (SSCH). In WCDMA, a 10 millisecond (ms) radio frame for the PSCH and the SSCH is divided into 15 slots, each slot having a length of 2560 chips. A WCDMA radio frame is shown in Table 1.

The PSCH comprises a modulated code having a length of 256 chips and is referred to as the primary synchronization code (PSC), denoted as $c_p$, and is transmitted once per slot. The PSC is the same for every cell in the WCDMA system.

TABLE 1

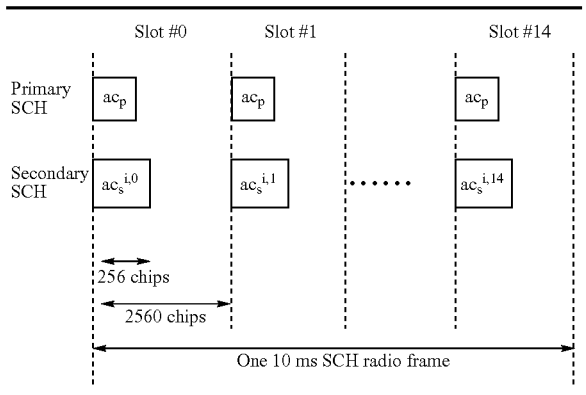

The SSCH comprises the repeated transmission of a sequence of codes having a length of 256 chips and is referred to as the secondary synchronization code (SSC). The SSC is referred to as $c_s^{i,k}$ where i=0, 1, . . . 63 is the number of the scrambling code group, and k=0, 1, . . . 14 is the slot number. The SSC is transmitted in parallel with the primary synchronization code (PSC) in the PSCH. Each SSC is chosen from a group of 16 different codes having a length of 256 chips. The SSC sequence on the SSCH indicates to which of the code groups the cell's downlink scrambling code belongs.

The primary and secondary synchronization codes are modulated by a symbol referred to "a." The symbol "a" indicates the presence or absence of space time transmit diversity (STTD) encoding on the primary common control physical channel (P-CCPCH) and is given by the following Table 2.

TABLE 2

| P-CCPCH STTD encoded | a = +1 |
|---|---|
| P-CCPCH not STTD encoded | a = −1 |

Regarding channel acquisition, including frequency and primary code (PSC) acquisition on the PSCH, if a large frequency error exists between a transmitter and receiver, the correlation of the 256 chips will suffer significant degradation. Because the PSC only transmits one symbol (256 chips in this example) in each slot, it typically must be averaged over many slots (for example, 60 slots) to be accurately decoded. In such a case, the frequency error causes the symbols in the received signal to drift. Furthermore, averaging the PSC over many slots causes significant performance degradation.

Therefore, it would be desirable to minimize the acquisition time of a portable communication device, while allowing the use of a low-cost frequency reference source.

SUMMARY

Embodiments of the invention include a multiple stage matched filter for a wireless receiver. In one embodiment, a two-stage matched filter comprises a receiver configured to develop a received signal, the received signal comprising a bit stream of signal samples, and a multiple stage matched filter configured to parallel process the received signal such that multiple codes are analyzed simultaneously to determine a frequency offset and a code location. In one embodiment, the multiple stage matched filter can be implemented without the use of multiplication logic, thereby reducing the overall processing complexity and the cost of the matched filter.

Related methods of operation are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable transceiver, the multiple simultaneous frequency and code acquisition system (hereafter referred to as the "multiple stage matched filter") can be implemented in any CDMA-based communication device.

Furthermore, the multiple stage matched filter can be implemented to operate in different modes to support multiple wireless standards. To support multiple wireless standards, the components to be described below may be designed to switch between the different modes of operation. The control circuitry in such an implementation can be implemented using specialized hardware elements and logic. The software portion can be stored in the memory and be executed by a suitable instruction execution system (i.e., a microprocessor).

The hardware implementation of the multiple stage matched filter can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the multiple stage matched filter comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 1:
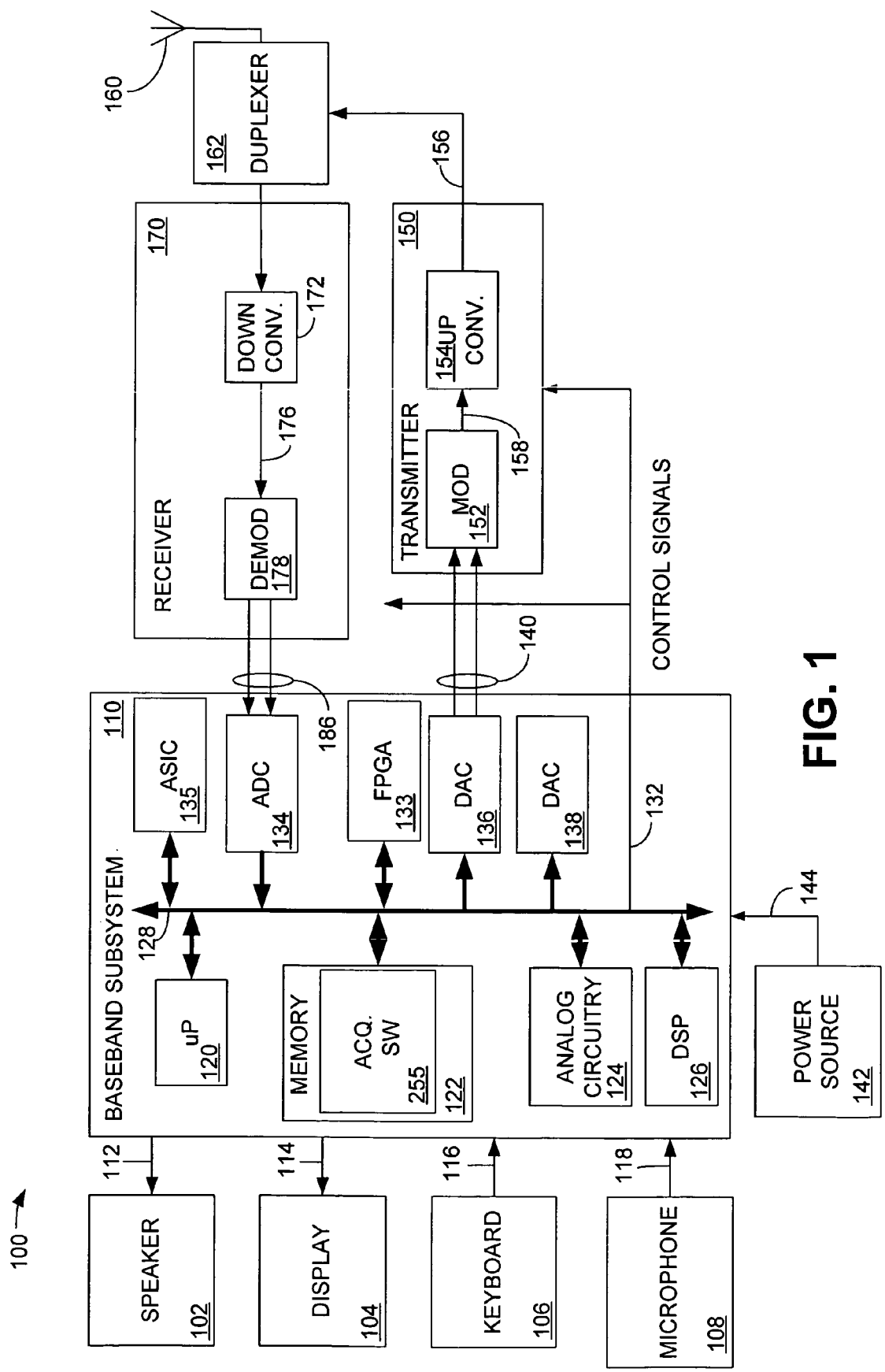
FIG. 1 is a block diagram illustrating a simplified portable transceiver including a filter chain in accordance with the invention.

FIG. 1 is a block diagram illustrating a simplified portable transceiver 100 including a multiple stage matched filter. Portable transceiver 100 includes speaker 102, display 104, keyboard 106, and microphone 108, all connected to baseband subsystem 110. A power source 142, which may be a direct current (DC) battery or other power source, is also connected to the baseband subsystem 110 via connection 144 to provide power to the portable transceiver 100. In a particular embodiment, portable transceiver 100 can be, for example but not limited to, a portable telecommunication device such as a mobile cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (μP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110.

In one embodiment, depending on the manner in which the multiple stage matched filter to be described below is implemented, the baseband subsystem 110 may also include an application specific integrated circuit (ASIC) 135 and/or a field programmable gate array (FPGA) 133.

Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to transmitter 150 and receiver 170 via connection 132. Although shown as a single connection 132, the control signals may originate from the DSP 126, the ASIC 135, the FPGA 133, or from microprocessor 120, and are supplied to a variety of connections within the transmitter 150 and the receiver 170. It should be noted that, for simplicity, only the basic components of portable transceiver 100 are illustrated herein. The control signals provided by the baseband subsystem 110 control the various components within the transmitter 150 and the receiver 170.

If the multiple stage matched filter control is implemented wholly or partially in software that is executed by the microprocessor 120, the memory 122 will also include the acquisition software 255. The acquisition software 255 comprises one or more executable code segments that can be stored in the memory and executed in the microprocessor 120. Alternatively, the functionality of the acquisition software 255 can be coded into the ASIC 135 or can be executed by the FPGA 133. Because the memory 122 can be rewritable and because the FPGA 133 is reprogrammable, updates to the acquisition software 255 can be remotely sent to and saved in the portable transceiver 100 when implemented using either of these methodologies.

Baseband subsystem 110 also includes analog-to-digital converter (ADC) 134 and digital-to-analog converters (DACs) 136 and 138. Although DACs 136 and 138 are illustrated as separate devices, it is understood that a single digital-to-analog converter may be used that performs the function of DACs 136 and 138. ADC 134, DAC 136 and DAC 138 may also communicate with microprocessor 120, memory 122, analog circuitry 124 and DSP 126 via bus 128. DAC 136 converts the digital communication information within baseband subsystem 110 into an analog signal for transmission to a modulator 152 via connection 140. Connection 140, while shown as two directed arrows, includes the information that is to be transmitted by the transmitter 150 after conversion from the digital domain to the analog domain.

The transmitter 150 includes modulator 152, which modulates the analog information in connection 140 and provides a modulated signal via connection 158 to upconverter 154. The upconverter 154 transforms and amplifies the modulated signal on connection 158 to an appropriate transmit frequency and power level for the system in which the portable transceiver 100 is designed to operate. Details of the modulator 152 and the upconverter 154 have been omitted for simplicity, as they will be understood by those skilled in the art. For example, the data on connection 140 is generally formatted by the baseband subsystem 110 into in-phase (I) and quadrature (Q) components. The I and Q components may take different forms and be formatted differently depending upon the communication standard being employed.

The upconverter 154 supplies the upconverted signal via connection 156 to duplexer 162. The duplexer comprises a filter pair that allows simultaneous passage of both transmit signals and receive signals, as known to those having ordinary skill in the art. The transmit signal is supplied from the duplexer 164 to the antenna 160.

A signal received by antenna 160 will be directed from the duplexer 162 to the receiver 170. The receiver 170 includes a downconverter 172, and a demodulator 178. The downconverter 172 includes a low-noise amplifier (LNA) (not shown) and circuitry (not shown) to convert the received signal from an RF level to a baseband level (DC). The DC level signal is sent to the demodulator 178.

The demodulator 178 recovers the transmitted analog information and supplies a signal representing this information via connection 186 to ADC 134. ADC 134 converts these analog signals to a digital signal at baseband frequency and transfers the signal via bus 128 to DSP 126 for further processing.

Figure 2:
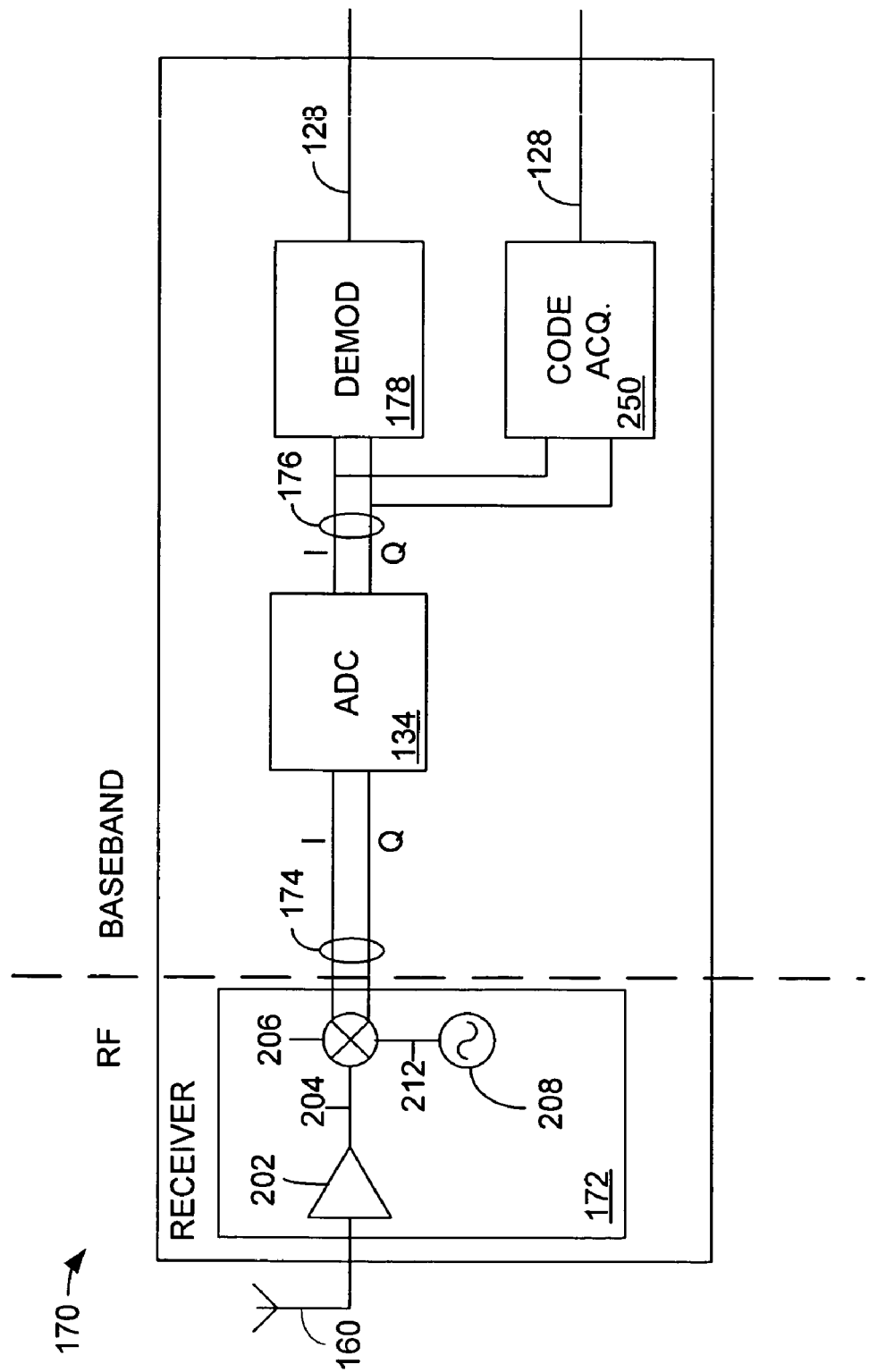
FIG. 2 is a block diagram illustrating an embodiment of the receiver of FIG. 1.

FIG. 2 is a block diagram illustrating an embodiment of the receiver 170 of FIG. 1. The down converter 172 includes a low noise amplifier 202, which supplies the received RF signal via connection 204 to the mixer 206. The mixer 206 also receives a local oscillator (LO) reference signal from the oscillator 208 via connection 212. The mixer 206 down converts the received RF signal on connection 204 to a baseband level either directly (e.g., in a direct conversion receiver) or using an intermediate frequency (IF) step. The output of the mixer 206 on connection 174 is illustrated using two connections, one for the in-phase (I) and the other for the quadrature (Q) component of the down converted signal. The in-phase (I) and quadrature (Q) components of the signal are delivered to the analog-to-digital converter (ADC) 134. Although shown in the baseband portion of FIG. 2, the function of the ADC 134 may occur in the RF portion of the receiver 170. The output of the ADC 134 on connection 176 is a digital bit stream, which is shown in FIG. 2 as separate in-phase and quadrature components. The in-phase and quadrature components are provided to the demodulator 178 and to the code acquisition element 250. The code acquisition element 250 is implemented using a multiple stage matched filter, which will be described below in FIG. 3.

Figure 3:
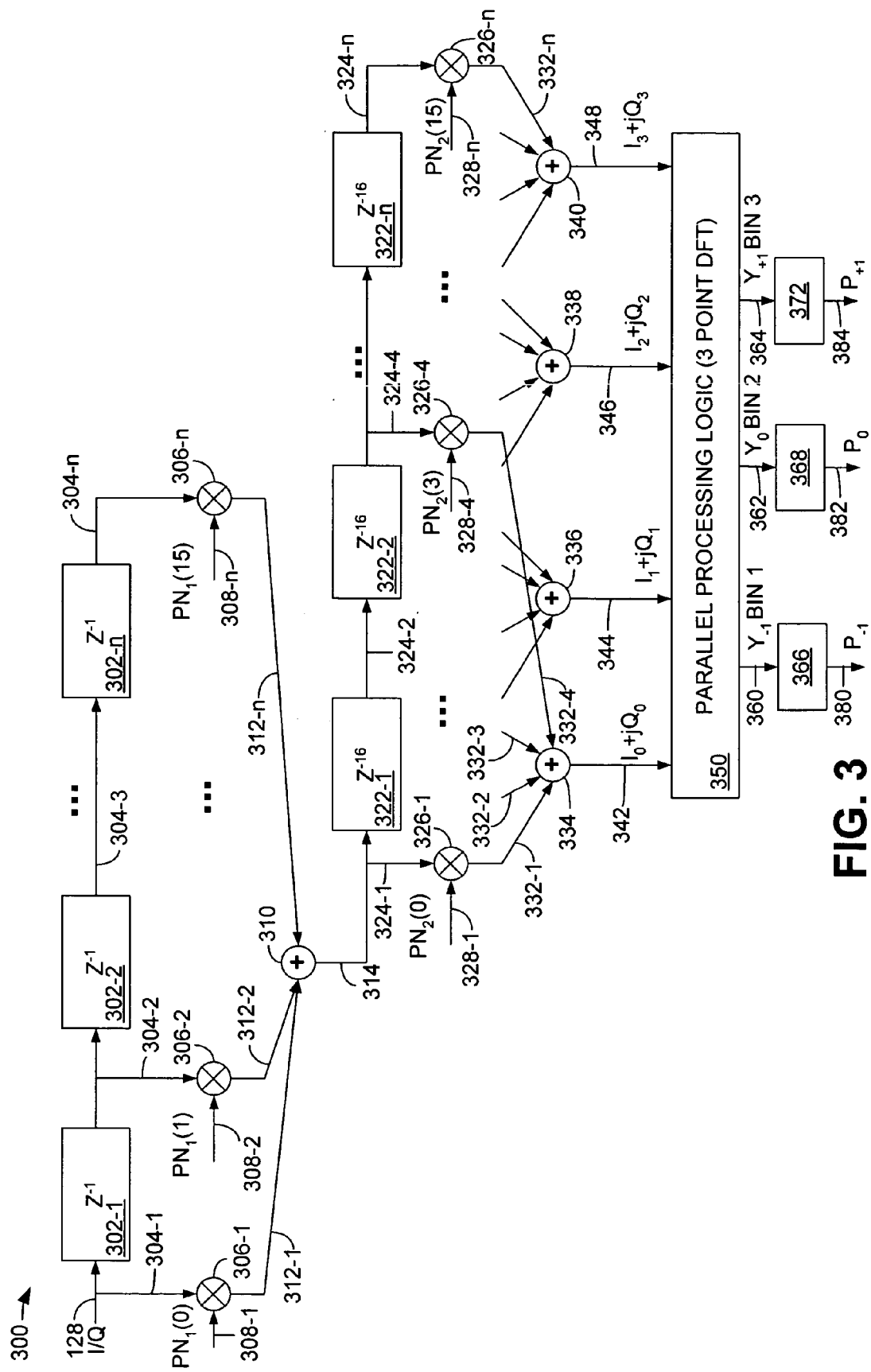
FIG. 3 is a block diagram illustrating one implementation of a multiple stage matched filter.

FIG. 3 is a block diagram illustrating one implementation of a multiple stage matched filter 300. In this example, a frequency search range of three (3) frequency bins is ±7.5 kHz, and frequency bins of −5 kHz, 0 and 5 kHz are selected. In this embodiment, the multiple stage matched filter 300 is implemented in hardware using logic that is executed in the baseband subsystem 110. For example, the logic that implements the multiple staged matched filter 300 can reside in the ASIC 135 or in the FPGA 133.

The primary synchronization code (PSC), referred to as $c_p$ is what is referred to as a "generalized hierarchical Golay sequence." The PSC is chosen to have a good a periodic auto correlation property and is defined as:

$$-a = <x_1, x_2, x_3, \ldots x_{16}> = <1, 1, 1, 1, 1, 1, -1, -1, 1, -1, 1, -1, 1, -1, -1, 1>.$$

The PSC is generated by repeating the sequence "a" modulated by a Golay complementary sequence and creating a complex valued sequence having identical real and imaginary components. The PSC $c_{psc}$ is defined as:

$$-c_{psc} = (1+j) \times <a, a, a, -a, -a, a, -a, -a, a, a, a, -a, a, -a, a, a>,$$ where the leftmost chip in the sequence corresponds to the chip transmitted first in time.

The multiple stage matched filter 300 receives the in-phase and quadrature components of the downconverted received signal from the ADC 134 via bus 128. The signal on bus 128 is a digital bit stream representing the received signal and is delivered to a plurality of register elements 302-1 through 302-n. For example, the signal on connection 128 is delivered to register 302-1 and via connection 304-1 to bit-wise operator 306-1. The signal on connection 304-1 can be referred to as the function $Si_0 + jSq_0$. The bit-wise operator 306-1 also receives a pseudorandom number (PN) via connection 308-1. For example, the pseudorandom number delivered via connection 308-1 is characterized as $PN_1(0)$. The bit-wise operator 306-1 performs the function $Si_0*PN_1(0)+jSq_0*PN_1(0)$. In this example, the bit-wise operator 306-1 performs an exclusive OR (XOR) operation between the multiple bit signal on connection 304-1 and the single bit PN value on connection 308-1. Similarly, the output of the register 302-1 on connection 304-2 is supplied to bit-wise operator 306-2. A pseudorandom number $PN_1(1)$ is supplied to the bit-wise operator 306-2 via connection 308-2. The relationship between $(PN_1(0), \ldots, PN_1(15))$ and $(x_1, x_2, \ldots, x_{16})$, as described above, is $PN_1(0)=x_{16}$; $PN_1(1)=x_{15}, \ldots, PN_1(15)=x_1$. The relationship among $\{PN_2(0), \ldots PN_2(15)\}$ is $\{PN_2(15), PN_2(14), PN_2(0)\}=\{-1, 1, -1, 1, 1\}$.

This architecture is repeated, for example in this embodiment, fifteen times. In other words, there are fifteen instances of the register 302 and sixteen instances of the bit-wise operator 306. The output of each bit-wise operator 306 is delivered to a summing element 310. For example, the output of bit-wise operator 306-1 is delivered via connection 312-1 to the summing element 310; the output of bit-wise operator 306-2 is supplied via connection 312-2 to summing element 310; and the output of bit-wise operator 306-n is supplied via connection 312-n to the summing element 310. The elements described thus far comprise what is referred to as a "first stage" of the multiple stage matched filter.

The output of the summing element 310 on connection 314 is delivered to a set of "second stage" registers. The output of the summing element 310 on connection 314 is delivered to register 322-1. For example, there are fifteen second stage registers 322-1 through 322-n. Each second stage register 322 provides up to a 16 clock shift delay between the input and the output. The signal on connection 314 represents a combination of sixteen iterations of the received signal sourced from connection 128. The signal on connection 314 is also supplied via connection 324-1 to bit-wise operator 326-1. A second stage pseudorandom number $PN_2(0)$ is supplied via connection 328-1 to the bit-wise operator 326-1. Similarly, the output of the fourth register 322-4 is supplied to a fourth bit-wise operator 326-4 via connection 324-4. A fourth pseudorandom number $PN_2(3)$ is supplied via connection 328-4 to the bit-wise operator 326-4. Similarly, the output of each register 322 along with a pseudorandom number is supplied to each of sixteen bit-wise operators 326-1 through 326-n.

The output of the bit-wise operator 326-1 is supplied via connection 332-1 to summing element 334. Similarly, the outputs of the first four bit-wise operators 326-1 through 326-4 are supplied to the summing element 334. Similarly, the outputs of the following four bit-wise operators 326-5 through 326-8 (not shown) are supplied to a summing element 336; the outputs of bit-wise operators 326-9 through 326-12 (not shown) are supplied to summing element 338; and the outputs of bit-wise operators 326-13 through 326-n (a total of sixteen in this example) are supplied to the summing element 340.

The output of summing element 334 via connection 342 can be characterized as $I_0+jQ_0$. The output of summing element 344 can be characterized as $I_1+jQ_1$, the output of summing element 338 on connection 346 can be characterized as $I_2+jQ_2$ and the output of summing element 340 on connection 348 can be characterized as $I_3+jQ_3$.

The outputs on connections 342, 344, 346 and 348 are delivered to the parallel processing logic 350. The parallel processing logic 350, in this example, implements a three point discrete Fourier transform (DFT). The outputs of the parallel processing logic 350 are signals corresponding to, in this example, three different frequency bins which are searched to determine the oscillator frequency and the oscillator frequency offset, as will be described below. For example, the output of the parallel processing logic on connection 360 (referred to as frequency bin 1) can be characterized as $Y_{-1}$, the output of the parallel processing logic 350 on connection 352 (referred to as frequency bin 2) can be characterized as $Y_0$ and the output of parallel processing logic 350 on connection 364 (referred to a frequency bin 3) can be characterized as $Y_{+1}$. By carefully choosing the frequencies and frequency offset to be analyzed, the multiple stage matched filter 300 can be implemented without the use of costly multipliers. Depending on the implementation, more or fewer frequency bins than those described here can be analyzed.

The parallel processing logic 350 implements the following mathematic computations, which can be performed in the ASIC 135, the FPGA 133, or the microprocessor 120 (FIG. 1):

$$Y_{-1} = (I_0 + jQ_0) + (I_1 + jQ_1)\left(\frac{\sqrt{3}}{2} + \frac{1}{2}j\right) + \qquad \text{Equation I}$$

$$(I_2 + jQ_2)\left(\frac{1}{2} + \frac{\sqrt{3}}{2}j\right) + (I_3 + jQ_3)(0+j)$$

$$\frac{\sqrt{3}}{2} = 0.86602 \sim \frac{7}{8} \quad \text{error} = 1\%$$

$$Y_{-1} = \left(I_0 + \frac{7}{8}I_1 + \frac{1}{2}I_2\right) - \left[\frac{1}{2}Q_1 + \frac{7}{8}Q_2 + Q_3\right] +$$

$$j\left\{\left[Q_1 + \frac{7}{8}Q_1 + \frac{1}{2}Q_2\right] + \left[\frac{1}{2}I_1 + \frac{7}{8}I_2 + I_3\right]\right\}$$

$$= A - B + j\{C + D\}$$

Similarly, $$Y_{+1} = \left(I_0 + \frac{7}{8}I_1 + \frac{1}{2}I_2\right) + \left(\frac{1}{2}Q_1 + \frac{7}{8}Q_2 + Q_3\right) +$$

$$j\left\{\left[Q_0 + \frac{7}{8}Q_1 + \frac{1}{2}Q_2\right] - \left[\frac{1}{2}I_1 + \frac{7}{8}I_2 + I_3\right]\right\}$$

$$= A + B + j\{C - D\}$$

$Y_{-1}=A-B+j(C+D)$     2 adders $Y_0=\Sigma I_i+j\Sigma Q_i$     6 adders $Y_{+1}=A+B+j(C-D)$     2 adders The outputs $Y_{-1}$, $Y_0$ and $Y_{+1}$ from the parallel processing logic 350 on connections 360, 362 and 364, respectively, are provided to power functions 366, 368 and 372, respectively.

The output of the power function 366 on connection 380 is $P_{-1}=|Y_{-1}|^2$.

The output of the power function 368 on connection 382 is $P_0=|Y_0|^2$.

The output of the power function 372 on connection 384 is $P_{+1}=|Y_{+1}|^2$.

Figure 4:
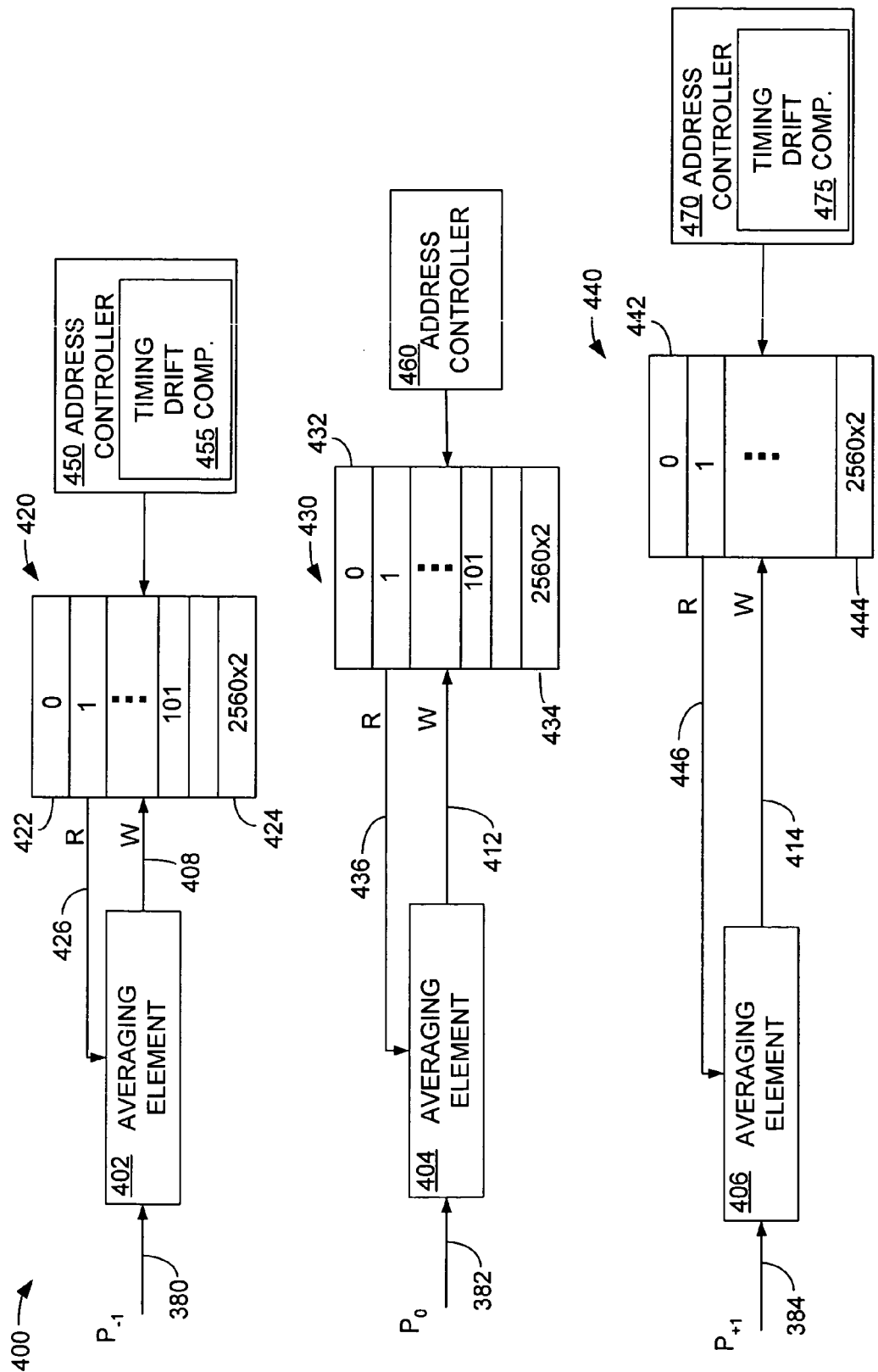
FIG. 4 is a block diagram illustrating one possible implementation used to average the frequency bin outputs of FIG. 3 to determine the frequency offset of the received signal.

FIG. 4 is a block diagram illustrating one possible implementation used to average the output powers $P_{-1}$, $P_0$ and $P_{+1}$ of FIG. 3 and to perform timing drift compensation to determine frequency and code offset of the received signal.

The signal on connection 380 is delivered to averaging element 402 of FIG. 4, the signal on connection 382 is supplied to averaging element 404 and the signal on connection 384 is supplied to averaging element 406. Each averaging element communicates with an associated memory element. The averaging element 402 communicates with memory 420 via write connection 408 and read connection 426. The averaging element 404 communicates with memory 430 via write connection 412 and read connection 436. The averaging element 406 communicates with memory 440 via write connection 414 and read connection 446. The memory 420 is controlled by address controller 450, the memory 430 is controlled by address controller 460 and the memory element 440 is controlled by address controller 470. The address controller 450 includes timing drift compensation element 455 and the address controller 470 includes timing drift compensation element 475.

The averaging process will first be described without performing timing drift compensation. This is the case with the output $P_0$ on connection 382 when the frequency offset is zero. Because the output $P_0$ runs at twice the chip rate and the PSH code appears every 2560 chips there are 2560*2=5120 code offset locations. If averaging is performed over all of the possible code offset locations and a search is performed in the locations in memory 430, the location that contains the highest average power indicates code synchronization. In one embodiment, the size of the memory 430 (i.e., RAM in this example) is selected to be equal to the number of code offset locations, which in this example is 2650×2 memory locations. Each memory location stores the averaged power for a particular code location. One previous stored value is sequentially read out of the memory 430 via connection 436 at the operating frequency (2× of chip rate). In this manner, the averaging process is performed using the previous averaged data and the current $P_0$ value. The updated data is then written back to the memory 430 via the write connection 412. After 5120 cycles, values at all the code locations in the memory 430 are updated once. After a sufficient number (e.g., 40-60) of averaging cycles for each location, the code location having the largest average power is determined.

There are two ways to perform the averaging processes. One is an accumulation process. For the particular location, the new (updated) value is equal to the summation of the previous value and the current $P_0$ value. The other averaging process is referred to as "exponential window averaging" which can be defined by the equation: Pave_updated=(1−$a_0$)*Pave_old+$a_0$*$P_0$; where $a_0$ is a programmable value to determine the averaging window length.

For signals in which a frequency offset exists between transmit and receive, timing drift compensation can be used to perform the averaging process. Normalized (relative to one sampled duration) timing drift during one sampled duration is determined by $\Delta t=-\Delta f/(f_0+\Delta f)$, where $f_0$ is the sampling frequency (in this case $f_0$=2*3.84 megachips per second (Mcps)), and $\Delta f$ is a frequency offset between receive and transmit; (in this example, −5 kHz, +5 KHz).

Timing drift compensation is implemented by using the timing drift compensation elements 455 and 475 associated with the address controllers 450 and 470, respectively. The timing drift compensation elements control the memory address controllers to update the average power value contained in a particular memory location. One implementation is described as follows:

```
Accum_t = Accum_t + Δt;
If(Accum_t >0.5){
    Accum_t = Accum_t −1;
    Updated averaging value at the address by using current P and previous
    averaged value;
    Address counter is advanced by 1;
    Updates averaging value at new address by using current P and previous
    averaged value at new address;
    Address counter is advanced by 1;
}else if(Accum_t < −0.5){
    No updated operation at the current address
    Address counter stay the same;
}else{
    Updated averaging value at the address by using current P and previous
    averaged value;
    Address counter is advanced by 1;
}
```

Figure 5:
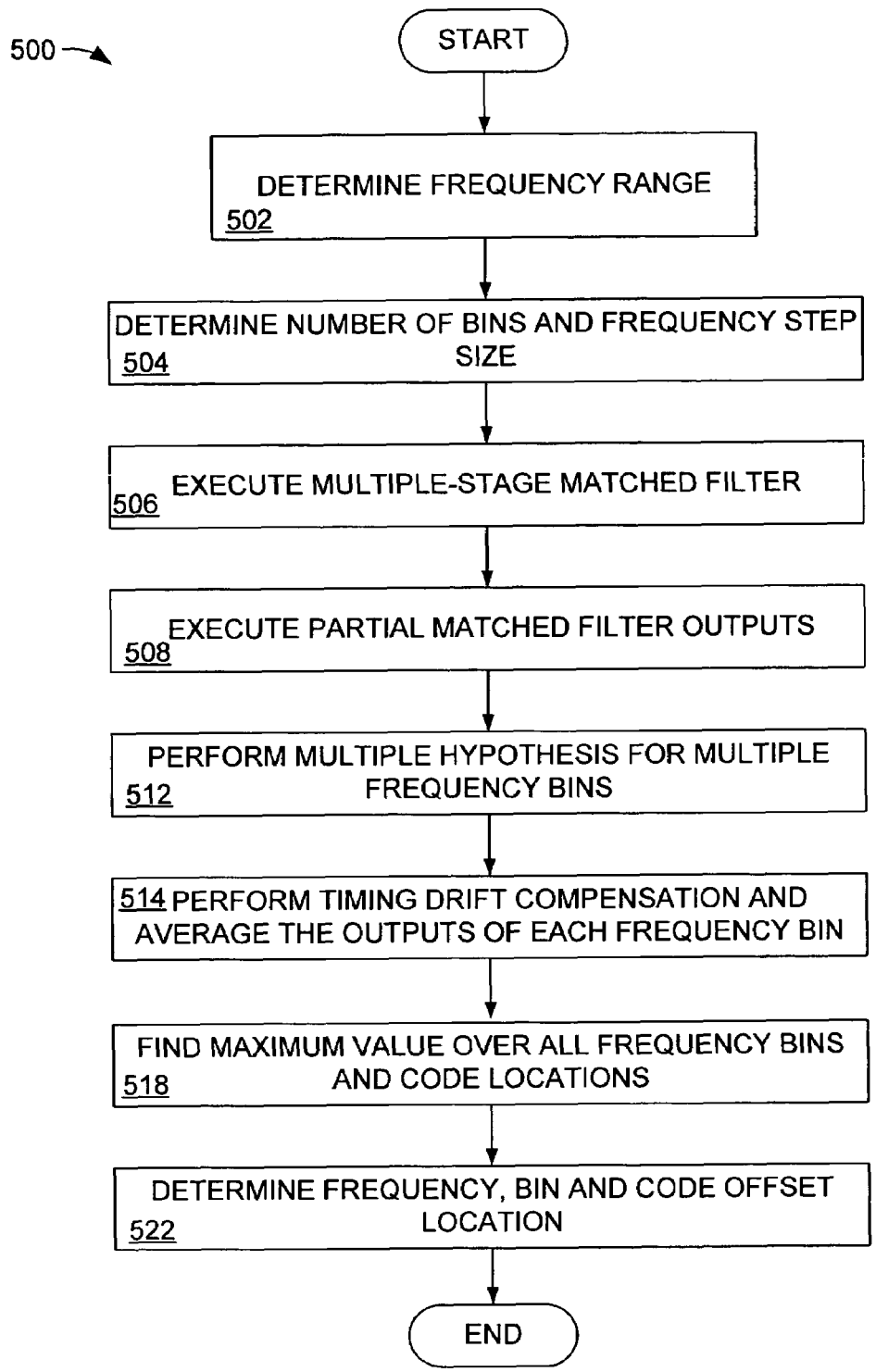
FIG. 5 is a flowchart illustrating the operation of one embodiment of the multiple stage matched filter of FIGS. 3 and 4.

FIG. 5 is a flowchart 500 illustrating the operation of one embodiment of the multiple stage matched filter of FIGS. 3 and 4. The blocks in the flowcharts are presented in the order shown for convenience only. The blocks may be performed out of the order shown, and may also be performed in parallel. In block 502, the maximum frequency offset range is determined based on, for example, the part per million (ppm) accuracy of the crystal oscillator within the portable communication device 100. In block 504, the number of frequency bins and the frequency step size is chosen. This is done based on the performance requirements of the system. For example, with regard to FIGS. 3 and 4, 3 frequency bins are searched and a frequency search range of ±7.5 kHz and a frequency step size of 5 kHz was used, where each frequency bin covers ±2.5 kHz, and the frequency bins are set as −5, 0 and +5 kHz.

In block 506, the multiple stage matched filter shown in FIG. 3 is executed. Parallel processing for multiple frequency bins is embedded into the second-stage matching filter, using multiple signals from the matching filter. In block 508, and for the second stage filter output, multiple partial matched filter outputs are obtained. The matched filter output is defined as $\Sigma Ii+j\Sigma Qi$ (the sum of Ii+jsum of Qi). Ii+jQi (i=0,1,2,3) defines the partial matched filter output.

In block 512, multiple hypotheses is performed for the multiple frequency bins as described above to arrive at the values for $P_{−1}$, $P_0$ and $P_1$. In block 514 the outputs $P_{−1}$, $P_0$ and $P_1$ are averaged and timing drift compensation, as described in FIG. 4, is performed. In block 518, a maximum value across all frequency bins and code locations is determined by analyzing the contents of the memories 420, 430, and 440. In block 522, the frequency bin and the code offset locations are determined.

For example, if after searching the memories 420, 430 and 440, the maximum value is located at memory address 101 in memory 420, the frequency offset will be −5 kHz, and the code offset location will be 101. After tuning the local oscillator frequency −5 kHz and setting the code offset location, frequency and code acquisition will be complete. Note that additional fine tuning on frequency estimation can be done by performing interpolation between two adjacent frequency bins. For example, by using the above example, if the maximum value is found at address 101 in memory 420 and a similar value is found at address 101 in memory 430, the frequency offset can be estimated to be between −5 kHz and 0 KHz and can be set as approximately −2.5 kHz.

Figure 6A:
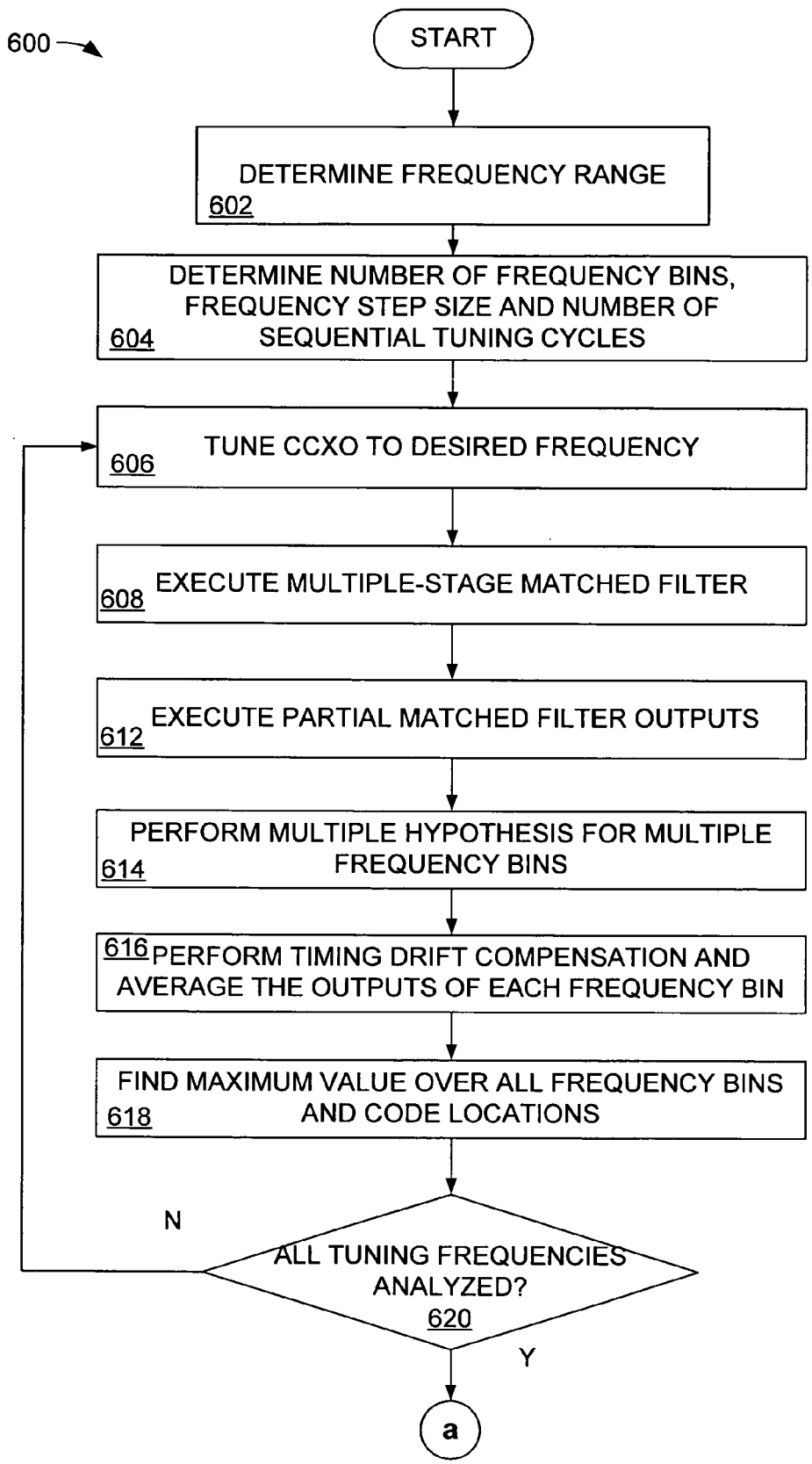
FIGS. 6A and 6B are a flowchart collectively describing the operation of another embodiment of the multiple stage matched filter of FIGS. 3 and 4.
Figure 6B:
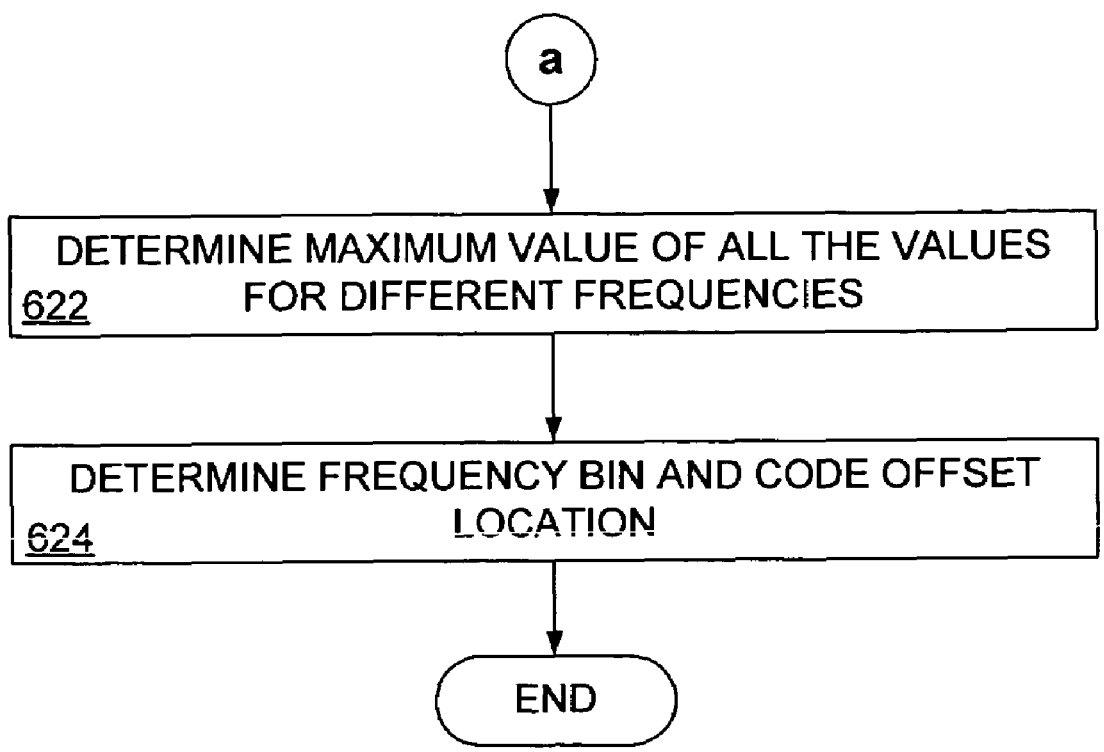

FIGS. 6A and 6B are a flowchart collectively describing the operation of another embodiment of the multiple stage matched filter of FIGS. 3 and 4. The embodiment of FIG. 6 is applicable to a capacitor controlled crystal oscillator (CCXO). Assume a CCXO having an accuracy of ±37.5 kHz, or about 19 ppm is used. Using the above-described methodology using three frequency bins (5 KHz frequency step size) the CCXO is sequentially tuned to frequencies of −30 kHz, −15 KHz, 0 KHz, +15 KHz, +30 KHz and the above-described joint frequency and code acquisition is performed for each frequency. The acquisition time is approximately 5 times faster than the baseline and is 3 times faster than using code acquisition only. If the above scheme with five frequency bins (5 KHz frequency step size) is used, the CCXO is sequentially tuned to frequencies of 25 KHz, 0, +25 kHz to get full coverage. The acquisition time is 3 times of the baseline and 5 times faster than a using code acquisition only.

In block 602, the maximum frequency offset range is determined based on, for example, the ppm accuracy of the crystal oscillator within the portable communication device 100. In block 604, the number of frequency bins, the frequency step size and the number of sequential tuning cycles is determined based on signal acquisition time, acquisition performance and hardware complexity.

In block 606, the CCXO is tuned to a desired frequency. In block 608, the multiple stage matched filter shown in FIG. 3 is executed. Parallel processing for multiple frequency bins is embedded into the second-stage matching filter, using multiple signals from the matching filter. In block 612, and for the second stage filter output, multiple partial matched filter outputs are performed.

In block 614, multiple hypotheses are performed for the multiple frequency bins as described above to arrive at the values for $P_{-1}$, $P_0$ and $P_1$. In block 616 the outputs $P_{-1}$, $P_0$ and $P_1$ are averaged and timing drift compensation, as described in FIG. 4, is performed. In block 618, a maximum value across all frequency bins and code locations is determined by analyzing the contents of the memories 420, 430, and 440.

In block 620 it is determined whether all frequencies have been analyzed. If all frequencies have not been analyzed, the process returns to block 606. If all the frequencies have been analyzed, then, in block 622, a maximum value of all the values for the different frequencies is determined. In block 624, the frequency bin and the code offset locations based on the maximum value associated with the frequency bin index and the address counter is determined.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for acquiring a signal in a wireless receiver, comprising:
    receiving a signal in a receiver;
    parallel processing the received signal in a plurality of matched filter stages, each matched filter stage comprising a plurality of registers, such that multiple codes are analyzed simultaneously, wherein the parallel processing further comprises:
    applying a first stage matched filter by performing a bit-wise operation on a plurality of received signal samples;
    applying a second stage matched filter by performing a bit-wise operation on a plurality of first stage frequency samples to develop a plurality of second stage signal samples;
    applying a multi-point discrete Fourier transform (DFT) to the second stage signal samples, wherein the multi-point discrete Fourier transform (DFT) results in signals occupying a plurality of frequency bins and the method further comprises determining a power of each of the second stage signal samples;
    averaging each of the signals within each of the multiple frequency bins to determine a maximum value; and
    performing a timing drift compensation on the signals in the multiple frequency bins having a frequency offset.

2. The method of claim 1, wherein the maximum value is used to determine frequency location.

3. The method of claim 1, wherein the maximum value is used to determine a code offset location.

4. The method of claim 1, wherein the timing drift compensation further comprises updating an average power value contained in a memory.

5. The method of claim 1, further comprising performing the averaging step over a plurality of different tuning frequencies.

6. A multiple stage matched filter for a wireless receiver, comprising:
    a receiver configured to develop a received signal, the received signal comprising a bit stream of signal samples;
    a multiple stage matched filter comprising a plurality of matched filter stages, each matched filter stage comprising a plurality of registers, configured to parallel process the received signal such that multiple codes are analyzed simultaneously to determine a frequency offset;
    a first stage matched filter configured to perform a bit-wise operation on a plurality of received signal samples;
    a second stage matched filter configured to perform a bit-wise operation on a plurality of first stage frequency samples to develop a plurality of second stage signal samples;
    logic for applying a multi-point discrete Fourier transform (DFT) to the second stage frequency samples;
    wherein the multi-point discrete Fourier transform (DFT) results in signals occupying a plurality of frequency bins and the logic further comprises determining a power of each of the second stage signal samples;
    logic for averaging each of the signals within each of the multiple frequency bins to determine a maximum value; and
    a timing drift compensation element for performing a timing drift compensation on the signals having a frequency offset.

7. The multiple stage matched filter of claim 6, wherein the maximum value is used to determine frequency location.

8. The multiple stage matched filter of claim 6, wherein the maximum value is used to determine a code offset location.

9. The multiple stage matched filter of claim 6, wherein the timing drift compensation further comprises updating an average power value contained in a memory.

10. The multiple stage matched filter of claim 6, further comprising averaging over a plurality of different tuning frequencies.

11. A portable transceiver, comprising:
a modulator configured to receive and modulate a data signal;
an upconverter configured to receive the modulated data signal and provide a radio frequency (RF) signal;
a transmitter configured to transmit the RF signal;
a receiver configured to develop a received signal, the received signal comprising a bit stream of signal samples;
a multiple stage matched filter comprising a plurality of matched filter stages, each matched filter stage comprising a plurality of registers, configured to parallel process the received signal such that multiple codes are analyzed simultaneously to determine a frequency offset;
a first stage matched filter configured to perform a bit-wise operation on a plurality of received signal samples;
a second stage matched filter configured to perform a bit-wise operation on a plurality of first stage signal samples to develop a plurality of second stage signal samples;
logic for applying a multi-point discrete Fourier transform (DFT) to the second stage frequency samples, wherein the multi-point discrete Fourier transform (DFT) results in signals occupying a plurality of frequency bins and the logic comprises determining a power of each of the second stage signal samples;
logic for averaging each of the signals within each of the multiple frequency bins to determine a maximum value; and
logic for performing a timing drift compensation on the signals in the multiple frequency bins having a frequency offset.

12. The portable transceiver of claim 11, wherein the maximum value is used to determine frequency location.

13. The portable transceiver of claim 11, wherein the maximum value is used to determine a code offset location.

14. The portable transceiver of claim 11, wherein the timing drift compensation further comprises updating an average power value contained in memory.

15. The portable transceiver of claim 11, further comprising averaging over a plurality of different tuning frequencies.

16. A portable transceiver, comprising:
means for receiving a signal in a receiver;
means for parallel processing the received signal in a plurality of matched filter stages, each matched filter stage comprising a plurality of registers, such that multiple codes are analyzed simultaneously;
means for applying a first stage matched filter by performing a bit-wise operation on a plurality of received signal samples;
means for applying a second stage matched filter by performing a bit-wise operation on a plurality of first stage signal samples to develop a plurality of second stage signal samples;
means for applying a multi-point discrete Fourier transform (DFT) to the second stage frequency samples, wherein the multi-point discrete Fourier transform (OFT) results in signals occupying a plurality of frequency bins and the means for applying a multi-point discrete Fourier transform (OFT) to the second stage frequency samples further comprises determining a power of each of the second stage signal samples;
means for averaging each of the signals within each of the multiple frequency bins to determine a maximum value; and
means for performing a timing drift compensation on the signals in the multiple frequency bins having a frequency offset.

17. The portable transceiver of claim 16, wherein the maximum value is used to determine frequency location.

18. The portable transceiver of claim 16, wherein the maximum value is used to determine a code offset location.

19. The portable transceiver of claim 16, wherein the timing drift compensation means further comprises means for updating an average power value contained in a memory.

20. The portable transceiver of claim 16, further comprising means for averaging over a plurality of different tuning frequencies.

* * * * *